SURFACE FIELD EFFECT TRANSISTOR AMPLIFIER

Filed June 16, 1958

2 Sheets-Sheet 1

INVENTOR
RALPH FORMAN
BY John F. Hohmann
ATTORNEY

June 19, 1962 R. FORMAN 3,040,266

SURFACE FIELD EFFECT TRANSISTOR AMPLIFIER

Filed June 16, 1958 2 Sheets-Sheet 2

INVENTOR
RALPH FORMAN
BY John F. Hohmann
ATTORNEY

United States Patent Office 3,040,266

Patented June 19, 1962

3,040,266

SURFACE FIELD EFFECT TRANSISTOR AMPLIFIER

Ralph Forman, Rocky River, Ohio, assignor to Union Carbide Corporation, a corporation of New York Filed June 16, 1958, Ser. No. 742,390
7 Claims. (Cl. 330—35)

Figure 1:
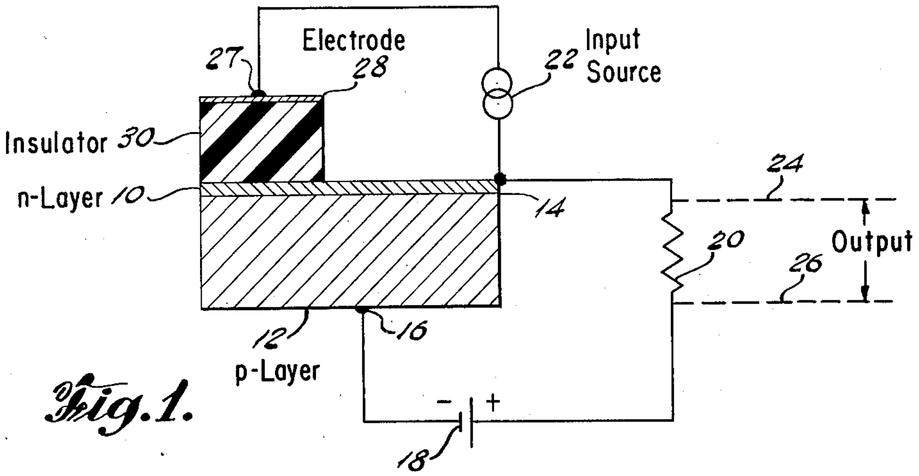

The invention relates to transistor-type devices wherein the carrier density of either the n- or p-layer of a p-n junction can be modulated by capacitatively inducing a change in charge at the surface of the given layer.

A conventional transistor can be visualized simply as consisting of two p-n junctions connected in series to give a relationship between the semi-conductors equivalent to p-n-p. The first p-type junction is an emitter biased in the forward direction as a diode with the other p-type junction serving as a collector, and being biased in the opposite direction. In this transistor structure the current flow is controlled by holes diffusing from the first p-junction through the n-junction base, thence to the other p-junction. The useful part of the current is that which crosses the n-junction base, and reaches the second p-junction.

Field effect transistors differ from conventional transistors of the type above discussed in that only electric fields are used to control the output current whereas conventional transistors use a current from the control electrode to accomplish this.

The principal object of this invention is to provide a field effect transistor having a high sensitivity to input signals, and in which the input and output circuits are decoupled with respect to direct current.

It is another object of the present invention to provide a semi-conductor device having high current and power amplification.

Figures 3, 4:
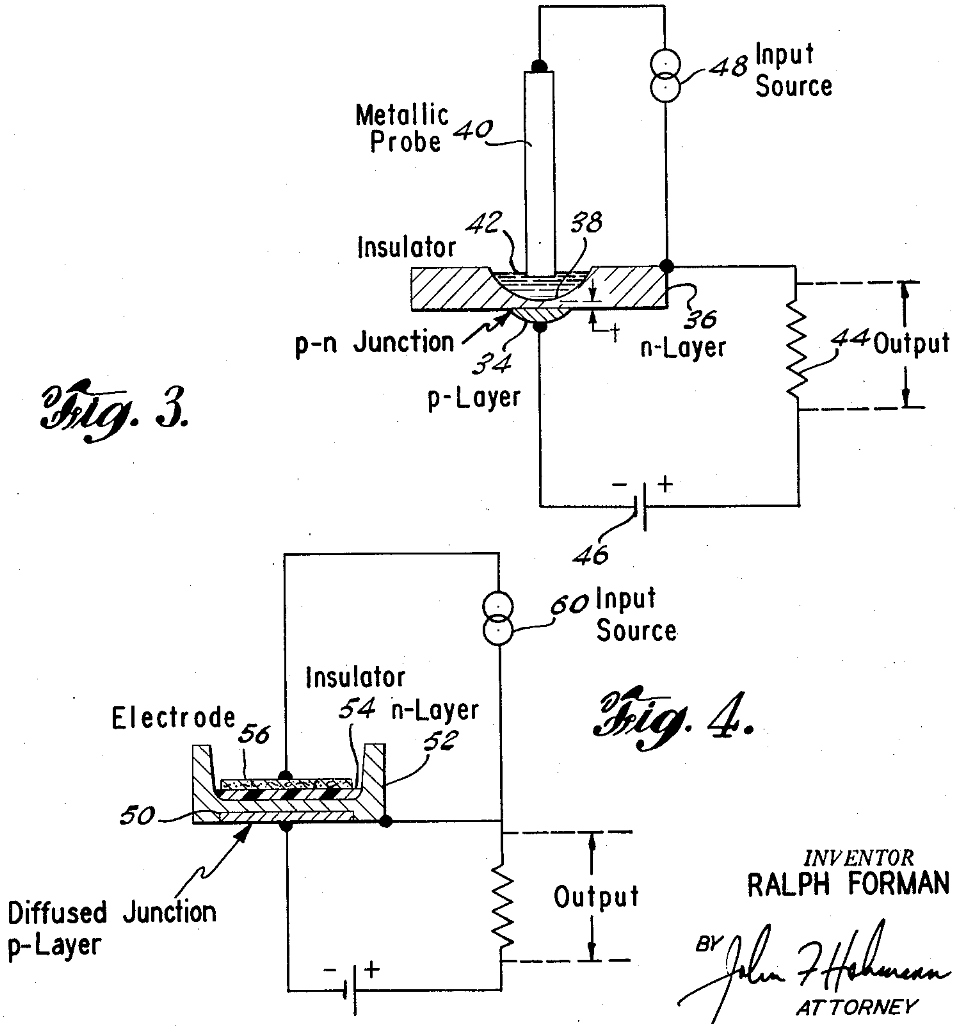
Figure 2A:
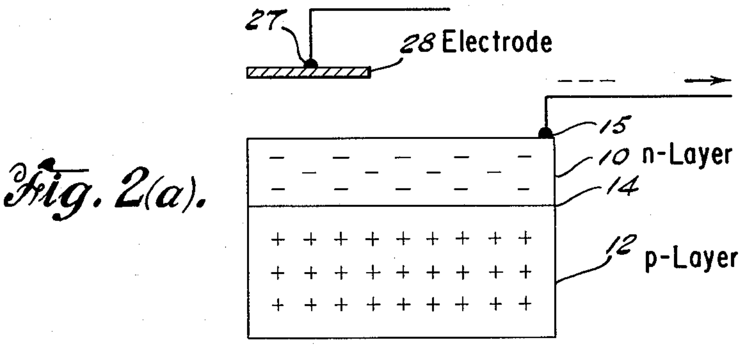
Figure 2B:
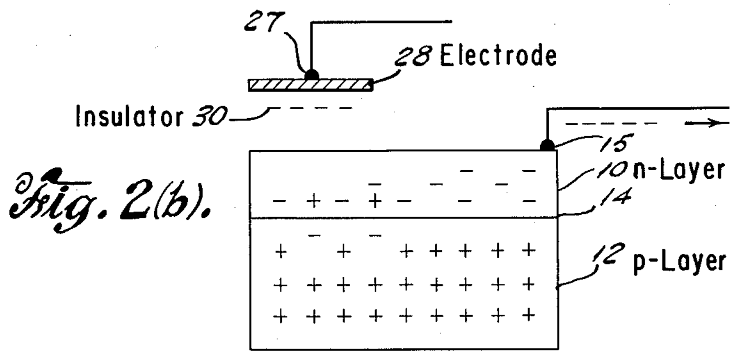
Figure 2C:
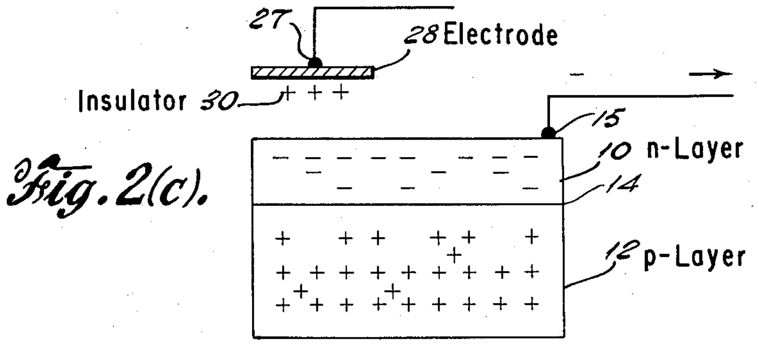

In the drawings:

FIG. 1 is a schematic cross-sectional representation of a device embodying the essential features of the invention;

FIGS. 2*a*, 2*b* and 2*c* are schematic representations showing the operation of the device; and FIGS. 3 and 4 are similar views of additional modifications of the invention.

The device of the invention possesses features similar to those of conventional transistors insofar as it is a three terminal device employing highly purified semi-conductive material such as silicon or germanium with a layer of p-type material in contact with a layer of n-type material. Unlike prior art devices, which modulate current flow across their barrier region by changing the applied current through the control electrode, attached thereto, the present device modulates current flow across the barrier region by capacitatively changing the applied field in the vicinity of the control electrode which is insulated from the barrier region.

Referring now to FIG. 1, it will be seen that the field effect transistor of the invention consists essentially of a semi-conductor, suitably germanium or silicon crystal, having a very thin (less than 0.001 inch) pure n-layer 10 or base, and a thicker highly doped p-layer 12 forming p-n junction 14 at their interface. To p-layer 12 is connected, through ohmic contact 16, the negative terminal of a source of reverse voltage 18. As employed herein, the term "reverse voltage" means that the p-region is made negative with respect to the n-region; similarly forward voltage means that the p-region is positive with respect to the n-region. Forward voltage bias produces high current flow through the junction for a unit voltage, while reverse voltage produces very low current flow through the junction. The positive terminal of the same voltage source is connected in series with load resistor 20 suitably of approximately 10,000 ohms and an ohmic contact with n-layer 10. Connected across load resistor 20 are output power take-off leads 24 and 26. The input voltage source 22 is connected to lead 24 and a terminal 27 in contact with the conducting electrode 28. The electrode 28 may suitably be composed of an evaporated metal (e.g., silver) film or a conducting silver paste applied to insulator 30, which has a high dielectric constant. The purpose of insulator 30 is to increase the induced charge on the n-layer for a given applied voltage $V_s$ from source 22. Since the induced surface charge is given by the product $CV_s$, where C is the capacity between terminal 27 and the surface of the base material 10, the induced surface charge can be maximized by using a material with a high dielectric constant, owing to the fact that C varies linearly with the dielectric constant. Unlike conventional transistors, there is no direct current flow here between $V_s$ and the device.

The above described structure can be better understood by referring to FIGURE 2, which show three enlarged views of the p-n junction region 14, and the thin n-layer 10. FIG. 2*a* illustrates the equilibrium condition when no voltage is applied to terminal 27 through the dielectric space 30, which is shown as open space for clarity. The minus signs refer to electrons in the n-region and the plus signs to holes in the p-region. When a negative voltage is applied to terminal 27, it induces a negative charge on conducting layer 28 as shown in FIG. 2*b*. This in turn induces a positive charge on the surface of the *n* semi-conductor surface facing 28. Since the majority carriers in the n-material are electrons, this positive charge arises because electrons move away from the surface as illustrated in FIG. 2*b*. In fact, we can consider some of them as spilling over into the p-region and similarly, some holes fall into the n-region as illustrated in FIG. 2*b*. In a p-n junction this effect is a similar one to that of lowering the reverse bias on the junction and, therefore, more current flows through the electrode 15.

On the contrary, if a positive voltage is placed on electrode 28, this induces a negative charge at the *n* semi-conductor surface as shown in FIG. 2*c*. By a similar line of reasoning it can be shown that this is similar to increasing the reverse bias of a p-n junction and the current will decrease as illustrated in FIG. 2*c*.

The principle of operation of the device shown in FIG. 1 can now be described in the following manner:

By applying a reverse voltage V from source 18 to the semi-conductor, a rectified current I is caused to flow through load 20. This current is proportional to the charge carrier density in the bulk of n-layer 10. Since the semi-conductor has a very thin n-layer 10 and a much thicker p-layer, the total number of free charge carriers (computed by multiplying the small free charge density in the n-layer by its cross-sectional area and thickness) in the n-part of the junction is small. Upon applying a sinusoidal voltage from voltage source 22 between conducting layer 28 and n-layer 10, a surface charge will be induced on the surface of the n-layer. If the total amount of surface charge thus induced is comparable to the total amount of free charge carriers in the thin n-layer, prior to the application of the sinusoidal voltage, the charge density in the bulk of the n-layer will change sinusoidally. Accordingly, inasmuch as the rectified current I is determined by the charge carrier density in the bulk of the n-layer, a sinusoidal variation will occur in I and appear as a voltage $V_o$ across load resistor 20.

Since the input voltage $V_s$ is applied to the semi-conductor through capacitive load 30, the input current is, therefore, 90° out of phase with the input voltage. As a result, the input power is negligible. On the other hand, the output voltage $V_o$ appears across a resistance 20, so that the output power $(V_o^2/R)$ can be made very large.

The present device, then, has been found to be capable of large power gains, of the order of 10,000 fold.

FIG. 3 illustrates a specific embodiment of the device of the invention. The p-n junction used here consists of an indium dot 34 fused to a high purity germanium slab 36. The surface of the germanium is preferentially etched until the thickness (*t*) of the n-layer facing the indium layer is less than 0.001 inch. In this manner a pit or cavity 38 is formed in the n-material. A metallic probe 40 then is placed in the cavity within a few microns from the germanium surface. A drop of liquid of high dielectric constant, suitably glycerine, ethylene glycol, or nitrobenzene (42) then was placed between the probe and the germanium. This in effect corresponds to the high dielectric material 30 of FIG. 1. Completing the circuit are resistance 44 (suitably of 10,000 ohms), a source of applied voltage 46 (6 volts), and a source of sinusoidal voltage 48 (0.1 volt) intermediate the probe and the slab. In the particular device described the input power was considerably less than 0.001 microwatt and the output voltage across resistor 44 was 0.1 volt, which corresponds to an output power of one microwatt or a power gain of greater than 1,000.

In FIG. 4 is illustrated another embodiment of the invention. It consists of a diffused p-n junction 50 prepared by diffusing boron into silicon, a thin n-layer 52 etched to a generally trough-like configuration having bonded thereto an insulator 54 of silicon dioxide of thickness approximately 4 millionths of an inch, and a conductor 56 suitably of silver paste. By means of the conductive coating on the dielectric material, it is possible to obtain a large capacitance across the dielectric coating which results in a large change in the charge density in the region of the p-n junction for a small applied signal from signal source 60.

The main advantage of the present device is that no filament power is needed as is the case with vacuum tube amplifiers. In addition, it is superior to the conventional transistor because its input and output circuits are decoupled with respect to direct current. In addition, the input impedance of the device is high, but its output impedance is low, so that the device compares favorably with a vacuum tube amplifier, rather than with a conventional transistor, which has low input impedance and high output impedance.

It should be understood that even though the descriptions discussed have been applied to a thin pure n-layer in contact with a highly doped p-layer, the device operates satisfactorily if the layers are interchanged; that is, a thin pure p-layer in contact with highly doped n-layer for a p-n junction. Other modifications will also occur to those skilled in the art.

What is claimed is:

1. A field effect transistor comprising a slab of high purity n-conductivity type material, a dot of p-conductivity material type on one side of said slab, a hemispherical cavity in said slab on the opposite side from said dot such that the distance between the center of said cavity and said dot is less than 0.001 inch, a substance having a high dielectric constant in said cavity, a metallic probe in contact with said substance but insulated thereby from said slab, a source of sinusoidal voltage in contact with said probe and said slab, and a source of applied voltage in contact with said dot of p-type material and a resistance intermediate said source of applied voltage and said slab.

2. The transistor of claim 1 wherein said n-conductivity material is a metal selected from the group consisting of germanium and silicon.

3. The transistor defined in claim 1 wherein said substance is glycerine.

4. The transistor defined in claim 1 wherein said substance is ethylene glycol.

5. The transistor defined in claim 1 wherein said substance is silicon dioxide.

6. The transistor defined in claim 1 wherein said substance is nitrobenzene.

7. A field effect transistor comprising a slab of high purity semiconductive material, a material of opposite conductivity on one side of said slab, a cavity in said slab on the side opposite said material of opposite conductivity such that the distance between the bottom of said cavity and said material of opposite conductivity is less than 0.001 inch, a substance having a high dielectric constant in said cavity, an electrode in contact with said substance but insulated thereby from said slab, a source of sinusoidal voltage in contact with said electrode and said slab, and a source of applied voltage in contact with said layer and a resistance intermediate said source of applied voltage and said slab.

References Cited in the file of this patent

UNITED STATES PATENTS

| | | |
|---|---|---|
| 1,769,874 | Boyer | July 1, 1930 |
| 2,524,033 | Bardeen | Oct. 3, 1950 |
| 2,563,503 | Wallace | Aug. 7, 1951 |
| 2,612,567 | Stuetzer | Sept. 30, 1952 |
| 2,648,805 | Spenke | Apr. 11, 1953 |
| 2,754,431 | Johnson | July 10, 1956 |
| 2,791,758 | Looney | May 7, 1957 |
| 2,791,759 | Brown | May 7, 1957 |
| 2,844,770 | Van Vessem | July 22, 1958 |
| 2,897,377 | Nelson | July 28, 1959 |